(12) United States Patent
Marshall et al.

(10) Patent No.: US 6,692,136 B2
(45) Date of Patent: *Feb. 17, 2004

(54) LED/PHOSPHOR-LED HYBRID LIGHTING SYSTEMS

(75) Inventors: Thomas M. Marshall, Hartsdale, NY (US); Michael D. Pashley, Cortlandt Manor, NY (US); Stephen Herman, Monsey, NY (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 10/302,315

(22) Filed: Nov. 22, 2002

(65) Prior Publication Data

US 2003/0067773 A1 Apr. 10, 2003

Related U.S. Application Data

(63) Continuation of application No. 09/453,420, filed on Dec. 2, 1999, now Pat. No. 6,513,949.

(51) Int. Cl.$^7$ ................................. F21V 9/00
(52) U.S. Cl. ................ 362/231; 362/230; 362/800
(58) Field of Search ........................... 362/228, 230, 362/231, 242, 293, 800, 84; 257/98, 99, 89, 100; 313/502, 503, 504

(56) References Cited

U.S. PATENT DOCUMENTS

| | | | | | |
|---|---|---|---|---|---|
| 5,803,579 | A | * | 9/1998 | Turnbull et al. | 362/293 |
| 5,813,753 | A | * | 9/1998 | Vriens et al. | 362/293 |
| 6,513,949 | B1 | * | 2/2003 | Marshall et al. | 362/231 |

* cited by examiner

*Primary Examiner*—Alan Cariaso
*Assistant Examiner*—Bao Q. Truong

(57) ABSTRACT

A hybrid lighting system for producing white light including at least one light emitting diode and phosphor-light emitting diode. The hybrid lighting system exhibits improved performance over conventional LED lighting systems that use LEDs or phosphor-LEDs to produce white light. In particular, the hybrid system of the invention permits different lighting system performance parameters to be addressed and optimized as deemed important, by varying the color and number of the LEDs and/or the phosphor of the phosphor LED.

16 Claims, 3 Drawing Sheets

LED/PHOSPHOR-LED HYBRID LIGHTING SYSTEMS

CROSS REFERENCE TO RELATED APPLICATIONS

This is a continuation of application Ser. No. 09/453,420, filed Dec. 2, 1999 now U.S. Pat. No. 6,513,949.

FIELD OF THE INVENTION

This invention relates to light emitting diode (LED) lighting systems for producing white light, and in particular to hybrid LED lighting systems for producing white light comprised of LEDs and phosphor-LEDs. The hybrid lighting system exhibits improved performance over conventional LED lighting systems that use LEDs or phosphor-LEDs to produce white light.

BACKGROUND AND SUMMARY

Conventional LED lighting systems for producing white light typically comprise either LEDs or phosphor-LEDs. Lighting systems which use LEDs produce white light by combining various combinations of red, green, and blue LEDs. Phosphor-LED based lighting systems produce white light by using one or more various luminescent phosphor materials on top of a blue light LED to convert a portion of the emitted blue light into light of a longer wavelength.

Lighting systems which use LEDs to produce white light are more efficient at the package level than lighting systems which use phosphor-LEDs. However, high quality white light is more difficult to achieve in LED based lighting systems. This is because LEDs manufactured to optimize total lighting system performance and production typically must be combined in an undesirably large integral number of LED chips to provide the requisite quantities of red, green and blue light when operated at full rated power. Moreover, the LED chips must be fabricated in different sizes to achieve the proper balance thus, increasing the production costs of the system. Since the green and blue LED chips are manufactured in the same AlInGaN technology, there are fabrication and cost advantages to making these chips the same size, and reasonably large.

There are other limitations associated with LED based lighting systems. Existing green LEDs operating at the very desirable light spectral wavelength of about 550 nm are very inefficient. The highest luminous-efficacy green LED operates at a less desirable light spectral wavelength of about 530 nm. Further, currently available efficient LEDs make good color rendering difficult to achieve. Good color rendering is possible, but places constraints on specific choices of LEDs.

Additionally, mixing LEDs to produce white light entails material and particularly efficiency costs. More specifically, many highly collimated mixing schemes are binary in that they mix two LEDs at a time. LED based lighting systems typically use three and four LEDs and thus, require two stages of mixing. Unfortunately, each stage of mixing has an efficiency cost which significantly lowers the performance of the system.

As alluded to earlier, it is easier to produce white light with phosphor-LED based lighting systems as compared with LED based lighting systems because phosphor-LEDs do not require mixing and have lower material costs (they are inherently mixed). However, they are less efficient by a factor of about two at the package level than LED based lighting systems because of quantum deficits and re-emission efficiencies.

Accordingly, there is a need for a lighting system which combines certain aspects of LED and phosphor-LED based lighting systems to achieve benefits beyond either system.

Accordingly, a lighting system for producing white light is disclosed that includes at least one LED and a phosphor LED disposed adjacent to the at least one LED.

BRIEF DESCRIPTION OF THE DRAWINGS

The advantages, nature, and various additional features of the invention will appear more fully upon consideration of the illustrative embodiments now to be described in detail in connection with accompanying drawings wherein.

It should be understood that these drawings are for purposes of illustrating the concepts of the invention and are not to scale.

DETAILED DESCRIPTION OF THE INVENTION

The hybrid lighting system of the invention generally comprises selectively combining one or more certain LEDs with a phosphor-LED consisting of a blue LED and at least one phosphor which emits at certain light spectral wavelength (color), to produce white light.

Figure 1A:
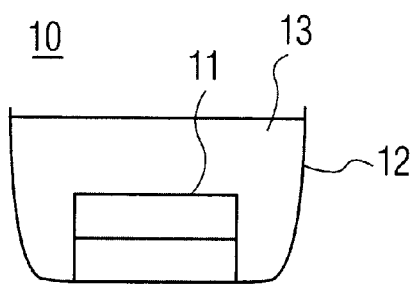
FIG. 1A is a sectional view of a typical LED used in the lighting system of the invention.

FIG. 1A schematically depicts a typical LED 10 used in the invention. The LED 10 is conventionally constructed using standard AlInGaN or AlInGaP processing and comprises an LED chip II mounted in a reflective metal dish or reflector 12 filled with a transparent epoxy 13.

Figure 1B:
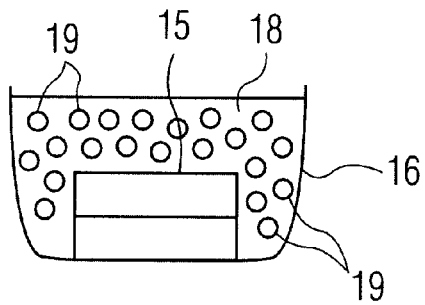
FIG. 1B is a sectional view of a typical phosphor-LED used in the lighting system of the invention.

FIG. 1B schematically depicts a typical phosphor-LED 14 used in the invention. This LED 14 is substantially identical in construction to the LED of FIG. 1A, except that the epoxy 18 filling the reflector 16 contains grains 19 of one or more types of luminescent phosphor materials mixed homogeneously therein. The phosphor grains 19 convert a portion of the light emitted by the LED chip 15 to light of a different spectral wavelength.

A primary advantage of the hybrid system of the invention is that it permits different lighting system performance parameters to be addressed and optimized as deemed important by varying the color and number of the LEDs and/or the phosphor of the phosphor-LED. In particular, the system of the present invention can address and achieve higher available lumens-per-chip averages via balancing red and green and blue light components; smaller integral numbers of LEDs at balance; improved color rendering; and more efficient mixing via the phosphor-LED. This in turn advantageously permits the manufacture of various types of products which are optimized for various applications using LED chips manufactured with standard AlInGaN and AlInGaP processing.

Figure 2:
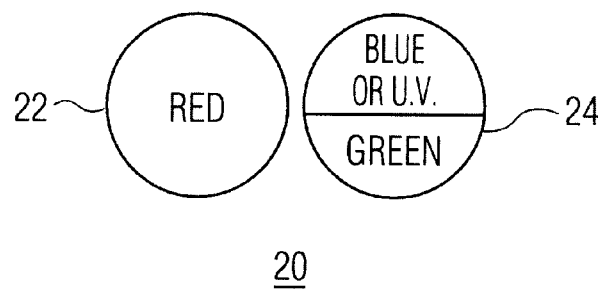
FIG. 2 is a schematic diagram depicting a first embodiment of the lighting system of the invention.

Each of the following embodiments illustrate how one or more of the above performance advantages can be achieved using the hybrid system of the invention. FIG. 2 schematically depicts a first embodiment of the hybrid lighting system of the invention denoted by numeral 20. The system 20 comprises a red LED 22 that emits light having a spectral wavelength of about 610 nm and a phosphor-LED 24 consisting of a blue LED that emits light having a spectral wavelength of between about 450 nm and 470 nm, and a phosphor material that converts a portion (typically about 50%) of the blue light to green light having a spectral wavelength of about 550 nm. This embodiment of the inventive system provides reasonable power balance and achieves an overall system efficiency comparable with or exceeding conventional LED based lighting systems because it eliminates the need for a less efficient green LED (typically emits light having a spectral wavelength of about 530 nm) as employed in conventional LED based lighting systems (the phosphor LED could be fundamentally more efficient than the green LED chip because it has better access to the 550 nm range and thus, has a lumen-per-watt advantage). Moreover, the two LEDs 22, 24 of this embodiment of the system 20 are easier and more efficient to mix, and require less complex LED drive electronics than conventional lighting systems which typically employ three or four LEDs. More specifically, there are many mixing schemes for mixing LEDs. In virtually all of these schemes, less mixing is desirable. For example, in binary mixing schemes, only one mixing stage is required to mix the two LEDs 22, 24 of the inventive system 20 compared with two mixing stages required for conventional LED based lighting systems. Hence, approximately half the mixing losses of conventional LED based lighting systems are incurred with this embodiment of the system. Therefore, significantly higher overall system efficiency can be realized in this embodiment of the system when compared with conventional LED based lighting systems. Color rendering is adequate owing to the 550 nm light provided by the phosphor-LED 24 although the color point can only be adjusted along a line. Consequently, control over color temperature is only possible at the design point. However, such an embodiment of the invention is especially useful for producing a fixed white light in lower cost lighting system applications where less expensive LED drive electronics are desirable and truly versatile control over color temperature is not significantly important.

Figure 3:
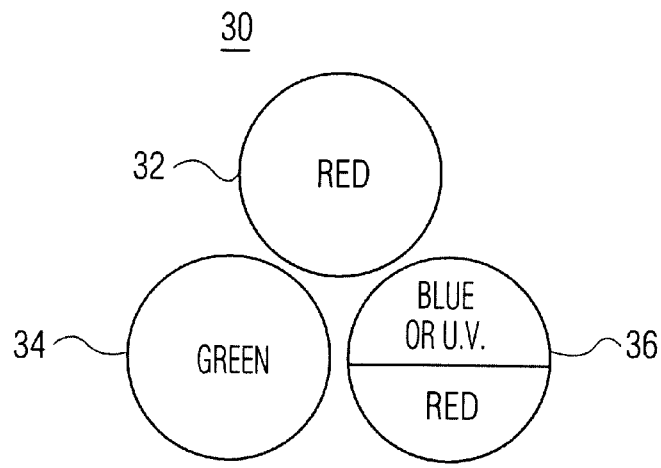
FIG. 3 is a schematic diagram depicting a second embodiment of the lighting system of the invention

FIG. 3 schematically depicts a second embodiment of the hybrid lighting system of the invention denoted by numeral 30. The system 30 comprises a red LED 32 (emits light having a spectral wavelength of about 610 nm), a green LED 34 (emits light having a spectral wavelength of about 530 nm) and a phosphor-LED 36 consisting of a blue LED (emits between ~450 nm and ~470 nm) and a phosphor material that converts a portion (about 50%) of the emitted blue light to red light (about 610 nm). In comparison to conventional LED based systems which typically produce insufficient quantities of red light and excessive quantities of blue light, the phosphor LED 36 used in this. embodiment of the inventive system balances the deficiency in red light output and attenuates the blue light output thereby providing good color balance with only three LEDs. Color rendering and color-temperature control is comparable to conventional LED based lighting systems. In particular, the use of three LEDs can provide maximum lumen content while permitting the color temperature to be freely adjusted, since the red content of the phosphor-LED 36 is sufficiently small to allow a balance to be struck by merely raising and lowering the brightness of the three LEDs via adjustments in the drive currents.

Figure 4:
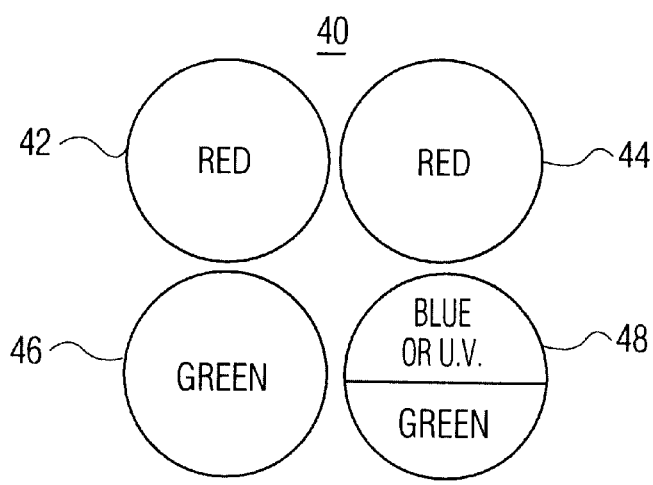
FIG. 4 is a schematic diagram depicting a third embodiment of the lighting system of the invention.

FIG. 4 schematically depicts a third embodiment of the hybrid lighting system of the invention denoted by numeral 40. The system 40 comprises two red LEDs 42, 44 (emits at ~610 nm), a green LED 46 (emits at ~530 nm), and a phosphor-LED 48 consisting of a blue LED (emits between ~450 nm and ~470 nm) and a phosphor material that converts a portion of the blue light to green light having a spectral wavelength of about 550 nm. Since the phosphor has a power conversion efficiency of about 50%, sufficient quantities of blue and green light are generated by the phosphor-LED 48 thereby providing excellent balance and color rendering at the design point owing to the presence of the 550 nm light. Additionally, the 550 nm light produces much greater lumen content, thereby providing this embodiment of the system with a higher lumen output, even when the phosphor's conversion energy loss if factored in.

Figure 5:
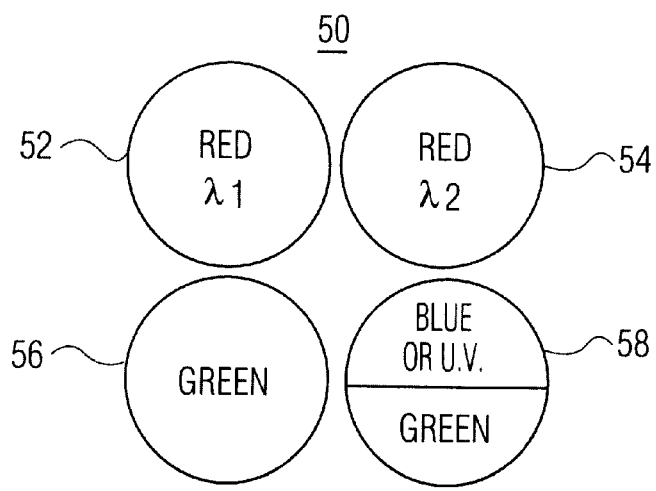
FIG. 5 is a schematic diagram depicting a fourth embodiment of the lighting system of the invention.

FIG. 5 schematically depicts a fourth embodiment of the hybrid lighting system of the invention denoted by numeral 50. The system 50 is substantially identical to the system of the third embodiment in that it comprises two red LEDs 52, 54, a green LED 56 and a phosphor-LED 58 that emits blue light and green light. However, the two red LEDs 52, 54 emit light at two slightly different spectral wavelengths (~610 nm and ~595 nm). The red LED emitting at about 595 nm produces a red color that is orange-amberlike to provide further improvements in color rendering.

Figure 6:
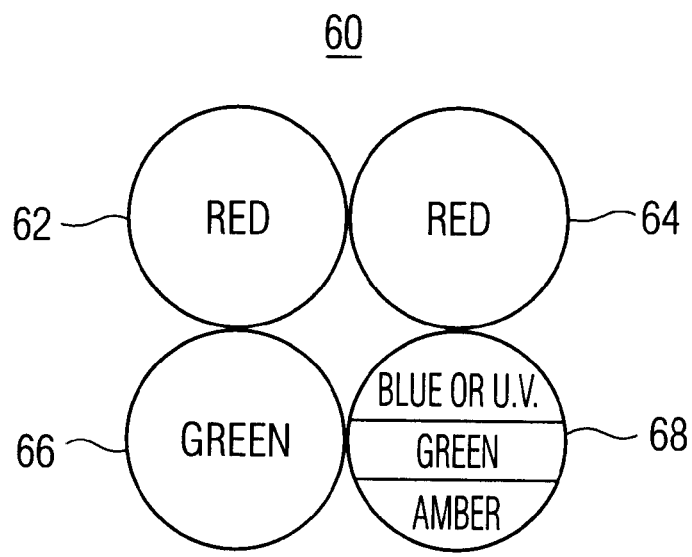
FIG. 6 is a schematic diagram depicting a fifth embodiment of the lighting system of the invention.

FIG. 6 schematically depicts a fifth embodiment of the hybrid lighting system of the invention denoted by numeral 60. The system 60 is substantially identical to the system of the third embodiment in that it comprises two red LEDs 62, 64, a green LED 66 and a phosphor-LED 68. However, the phosphor-LED 68 consists of a blue LED with a first phosphor material that emits at a light spectral wavelength of about 550 nm to convert a portion of the blue light to green light and a second phosphor material that converts a portion of the remaining blue light not converted by the first phosphor to an amber or yellow-green light. This embodiment exhibits further improvements in color rendering and is therefore useful in applications requiring maximized color rendering.

Figure 7:
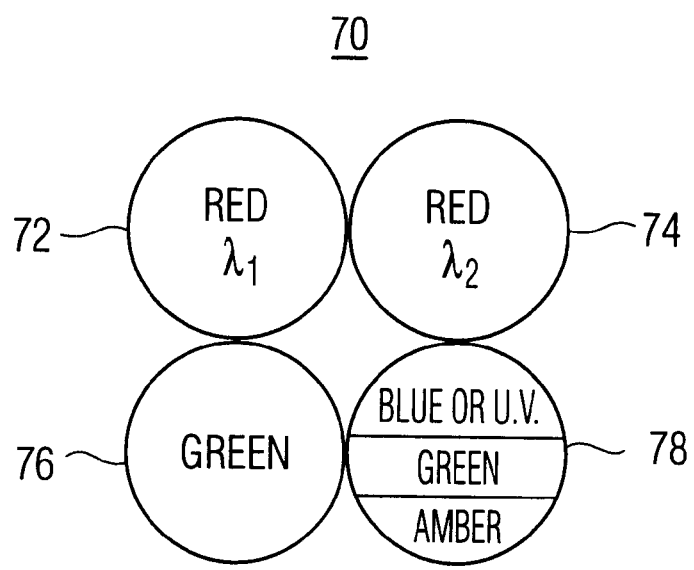
FIG. 7 is a schematic diagram depicting a sixth embodiment of the lighting system of the invention.

FIG. 7 schematically depicts a sixth embodiment of the hybrid lighting system of the invention denoted by numeral 70. The system 70 combines the features of the fourth and fifth embodiments and thus, comprises a first red LED 72 (emits at ~610 nm), a second red LED 74 (emits at ~595 nm), a green LED (emits at ~530 nm) 76, and a phosphor-LED 78. The phosphor LED consists of a blue LED (emits between ~450 nm and ~470 nm) and a first phosphor material that emits at a light spectral wavelength of about 550 nm to convert a portion of the blue light to green light and a second phosphor material that converts a portion of the remaining blue light not converted by the first phosphor, to an amber or yellow-green light. This embodiment is also especially useful in applications requiring optimized color rendering.

While the foregoing invention has been described with reference to the above embodiments, various modifications and changes can be made without departing from the spirit of the invention. Accordingly, all such modifications and changes are considered to be within the scope of the appended claims.

What is claimed is:

1. A lighting system for producing white light, the system comprising:
   at least one light emitting diode; and
   a phosphor-light emitting diode disposed adjacent to the at least one light emitting diode.

2. The lighting system according to claim 1, wherein the phosphor-light emitting diode emits at least two different colors of light.

3. The lighting system according to claim 1, further comprising at least a second light emitting diode.

4. The lighting system according to claim 3 wherein the phosphor-light emitting diode emits at least two different colors of light, one of the at least two colors being at least substantially identical to the color emitted by at least one of the light emitting diodes.

5. The lighting system according to claim 3, wherein the light emitted from the light emitting diodes are of the same general color but have different spectral wavelengths.

6. The lighting system according to claim 1, further comprising second and third light emitting diodes.

7. The lighting system according to claim 6, wherein the light emitted from two of the three light emitting diodes are of the same general color but have different spectral wavelengths.

8. The lighting system according to claim 7, wherein the phosphor-light emitting diode emits at least three different colors of light.

9. The lighting system according to claim 6, wherein the phosphor-light emitting diode emits at least three different colors of light.

10. The lighting system according to claim 6, wherein the phosphor-light emitting diode emits at least two different colors of light.

11. The lighting system according to claim 1, wherein the at least one light emitting diode emits red light.

12. The lighting system according to claim 11, wherein the phosphor-light emitting diode includes a blue light emitting diode that emits blue light and at least one phosphor that converts at least a portion of the blue light to one of a green light and a red light.

13. The lighting system according to claim 12, further comprising at least a second light emitting diode which emits green light.

14. The lighting system according to claim 13, further comprising a third light emitting diode which emits red light.

15. The lighting system according to claim 14, wherein the spectral wavelength of the red light emitted from the first light emitting diode is different from the spectral wavelength of the red light emitted from the third light emitting diode.

16. The lighting system according to claim 11, further comprising at least a second light emitting diode which emits green light.

* * * * *